(12) United States Patent
Hwang et al.

(10) Patent No.: US 7,568,517 B2
(45) Date of Patent: Aug. 4, 2009

(54) THERMAL MODULE

(75) Inventors: Ching-Bai Hwang, Guangdong (CN); Jui-Wen Hung, Guangdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 423 days.

(21) Appl. No.: 11/307,619

(22) Filed: Feb. 15, 2006

(65) Prior Publication Data
US 2007/0029071 A1 Feb. 8, 2007

(30) Foreign Application Priority Data
Aug. 5, 2005 (CN) .................. 2005 1 0036427

(51) Int. Cl.
*F28F 7/00* (2006.01)
(52) U.S. Cl. .................. 165/80.2; 165/80.3; 165/122; 165/104.21; 165/104.33; 361/700
(58) Field of Classification Search ....... 165/80.1–80.3, 165/121, 122, 104.21, 104.33, 104.26; 361/695, 361/697, 699, 700, 709
See application file for complete search history.

(56) References Cited

U.S. PATENT DOCUMENTS

| | | | | | |
|---|---|---|---|---|---|
| 4,897,712 | A | * | 1/1990 | Prokopp | 165/80.2 |
| 5,285,347 | A | * | 2/1994 | Fox et al. | 361/699 |
| 5,339,214 | A | * | 8/1994 | Nelson | 361/695 |
| 5,630,469 | A | * | 5/1997 | Butterbaugh et al. | 165/80.3 |
| 6,394,175 | B1 | * | 5/2002 | Chen et al. | 165/80.3 |
| 6,487,076 | B1 | * | 11/2002 | Wang | 361/697 |
| 6,542,364 | B2 | * | 4/2003 | Lai et al. | 361/697 |
| 6,626,233 | B1 | * | 9/2003 | Connors | 165/80.3 |
| 6,637,505 | B1 | * | 10/2003 | Sasaki | 165/122 |
| 6,724,625 | B2 | * | 4/2004 | Inoue | 361/700 |
| 6,779,595 | B1 | * | 8/2004 | Chiang | 165/104.33 |
| 6,781,834 | B2 | * | 8/2004 | Nair et al. | 361/697 |
| 6,781,835 | B2 | * | 8/2004 | Hashimoto et al. | 361/697 |
| 6,909,608 | B2 | * | 6/2005 | Fan | 361/700 |
| 6,964,295 | B1 | * | 11/2005 | Yu et al. | 165/104.33 |
| 6,967,845 | B2 | * | 11/2005 | Chiang et al. | 361/709 |
| 7,011,144 | B2 | * | 3/2006 | Zeighami et al. | 165/104.21 |
| 7,021,368 | B2 | * | 4/2006 | Lin et al. | 165/104.33 |
| 7,073,568 | B2 | * | 7/2006 | Chen et al. | 165/104.33 |
| 7,128,131 | B2 | * | 10/2006 | Kubo | 165/80.3 |
| 7,167,364 | B2 | * | 1/2007 | Lopatinsky et al. | 361/697 |
| 7,228,889 | B1 | * | 6/2007 | Tian et al. | 165/122 |

(Continued)

FOREIGN PATENT DOCUMENTS

CN 2233069 Y 8/1996

(Continued)

*Primary Examiner*—Ljiljana (Lil) V Ciric
(74) *Attorney, Agent, or Firm*—Winston Hsu (57) ABSTRACT

A thermal module (10) for dissipating heat from a heat-generating electronic component (20) includes a base plate (11), a heat-dissipating fan (16) mounted to one side of the base plate, at least a heat pipe (12) mounted to another side opposite to the one side of the base plate, and a fin assembly (14) mounted to an air outlet of the heat-dissipating fan. The heat pipe includes a bending portion (124). The fin assembly includes a portion (142) corresponding to the bending portion of the heat pipe. The fins of the portion of the fin assembly are arranged along an extension direction of the bending portion of the heat pipe.

15 Claims, 7 Drawing Sheets

U.S. PATENT DOCUMENTS

| | | | |
|---|---|---|---|
| 7,443,675 B2 * | 10/2008 | Hsiao | 361/700 |
| 2004/0105233 A1 | 6/2004 | Lai | |
| 2004/0201958 A1 | 10/2004 | Lev | |
| 2005/0099774 A1 * | 5/2005 | Song | 361/700 |
| 2005/0252640 A1 * | 11/2005 | Chang | 165/80.3 |

FOREIGN PATENT DOCUMENTS

| | | |
|---|---|---|
| JP | 2005-51127 | 2/2005 |
| TW | 545883 | 8/2003 |

* cited by examiner

THERMAL MODULE

FIELD OF THE INVENTION

The present invention relates generally to a thermal module, and more particularly to a thermal module for dissipating heat generated by electronic components.

DESCRIPTION OF RELATED ART

A thermal module generally includes a base plate, a blower mounted to a top side of the base plate, a rectangular-shaped fin assembly mounted at an outlet of the blower, and a plurality of heat pipes mounted to a bottom side of the base plate and thermally connecting a heat-generating electronic component with the fin assembly.

Each of the heat pipes includes an evaporator section contacting with the heat-generating electronic component, a condenser section remote from the heat-generating electronic component and thermally contacting with the fin assembly, and an adiabatic section interconnecting the evaporator section and the condenser section. A bending portion is formed at the of the condenser section of the heat pipe so that an end portion of the condenser section can be oriented to be in line with an orientation of the fin assembly which is usually mounted at a lateral end of the base plate and oriented to be perpendicular to an extension direction of the evaporator section and adiabatic section of the heat pipe.

In operation of the thermal module, the evaporator sections of the heat pipes absorb heat from the heat-generating component, and transfer the heat to the condenser sections of the heat pipes via the evaporation and condensation of the working medium filled in the heat pipes. Then, the heat is transferred to the base plate and further to the fin assembly. Finally, the heat is taken away by an airflow flowing through the fin assembly. Thus, the heat dissipation for the heat-generating component is accomplished.

During the operation of the thermal module, the heat is finally taken away by the airflow flowing through the fin assembly. So how to improve air convection efficiency of the fin assembly is the key to improve the heat dissipation efficiency of the thermal module.

Conventionally, one way to improve the air convection efficiency of the fin assembly is to increase heat exchanging areas between the fin assembly and the airflow passing through the fin assembly. One way to satisfy such requirement is to increase density of fins of the fin assembly, which improves the heat dissipation efficiency of the thermal module. The other way is to increase size of the fins. Both ways have their difficulties due to manufacturing and dimensional limitations. Furthermore, the fin assembly is formed as a rectangular-shaped configuration, which does not match the configuration of the bending portion of the heat pipe. This decreases thermal contacting areas between the bending portions of the heat pipes and the fin assembly. Thus, the heat at the condenser section is not totally directly transferred to the fin assembly from the heat pipes, which lowers the heat dissipation efficiency of the thermal module. Accordingly, the heat dissipation efficiency of the thermal module needs to be improved.

SUMMARY OF INVENTION

The present invention relates to a thermal module for dissipating heat from a heat-generating electronic component. According to a preferred embodiment of the present invention, the thermal module includes a base plate, a heat-dissipating fan mounted to one side of the base plate, at least a heat pipe mounted to another side opposite to the one side of the base plate, and a fin assembly mounted to air outlet of the heat-dissipating fan. The heat pipe includes a condenser section for releasing heat transferred by the heat pipe. The condenser section has a bending portion. The fin assembly includes a portion corresponding to the bending portion of the heat pipe. The fins of the portion of the fin assembly are arranged along an extension direction of the bending portion of the heat pipe.

Other advantages and novel features of the present invention will become more apparent from the following detailed description of preferred embodiment when taken in conjunction with the accompanying drawings, in which:

DETAILED DESCRIPTION

Figure 1:
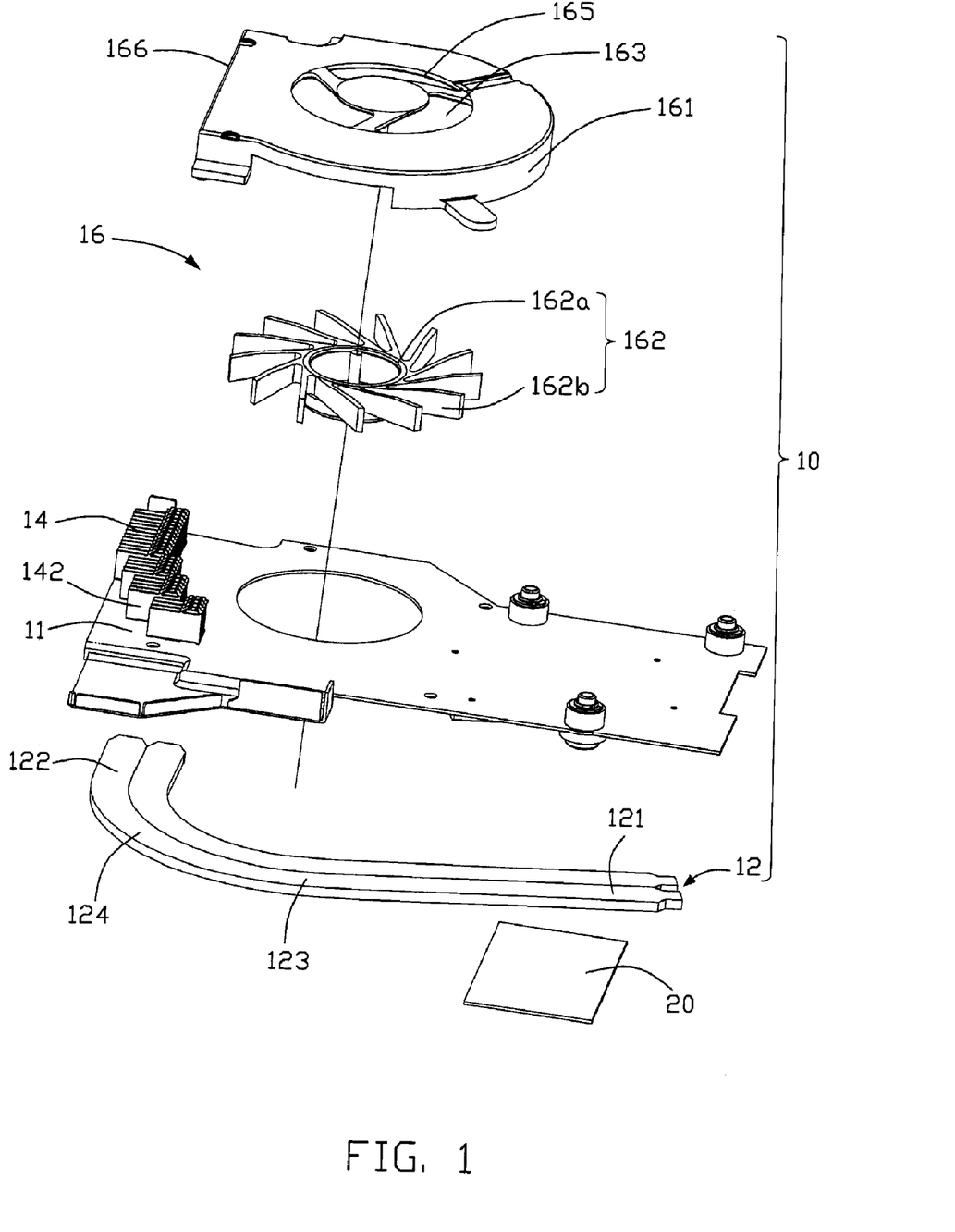
FIG. 1 is an exploded, isometric view of a thermal module according to a preferred embodiment of the present invention.
Figure 2:
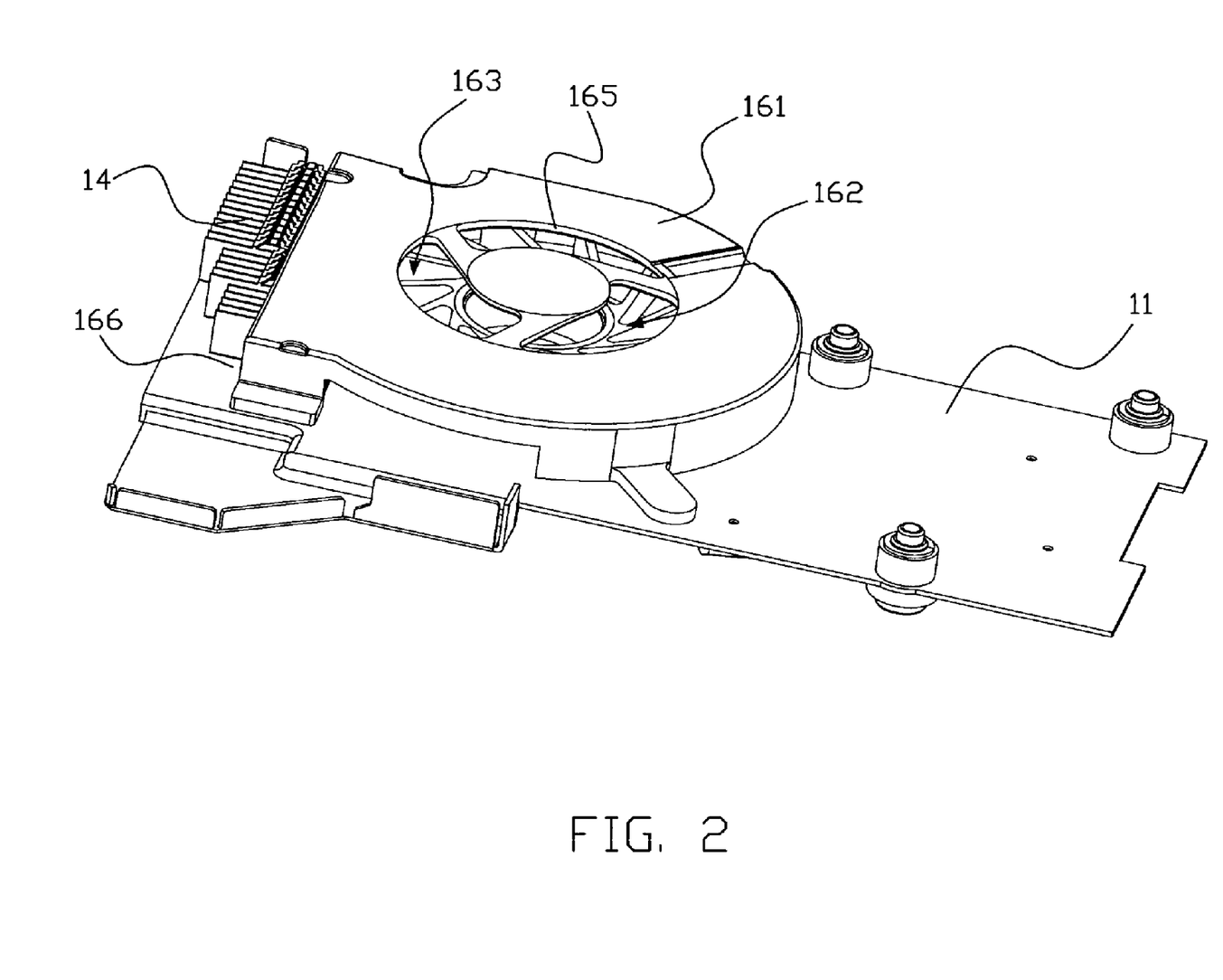
FIG. 2 is an assembled view of the thermal module of FIG. 1.

Referring to FIGS. 1 and 2, a thermal module 10 according to a preferred embodiment of the present invention is shown. The thermal module 10 includes a base plate 11, two heat pipes 12, a fin assembly 14, and a heat-dissipating fan 16.

The base plate 11 is made of materials having good heat conductive capability, and defines a lateral direction and a longitudinal direction perpendicular to the a lateral direction.

Figure 3:
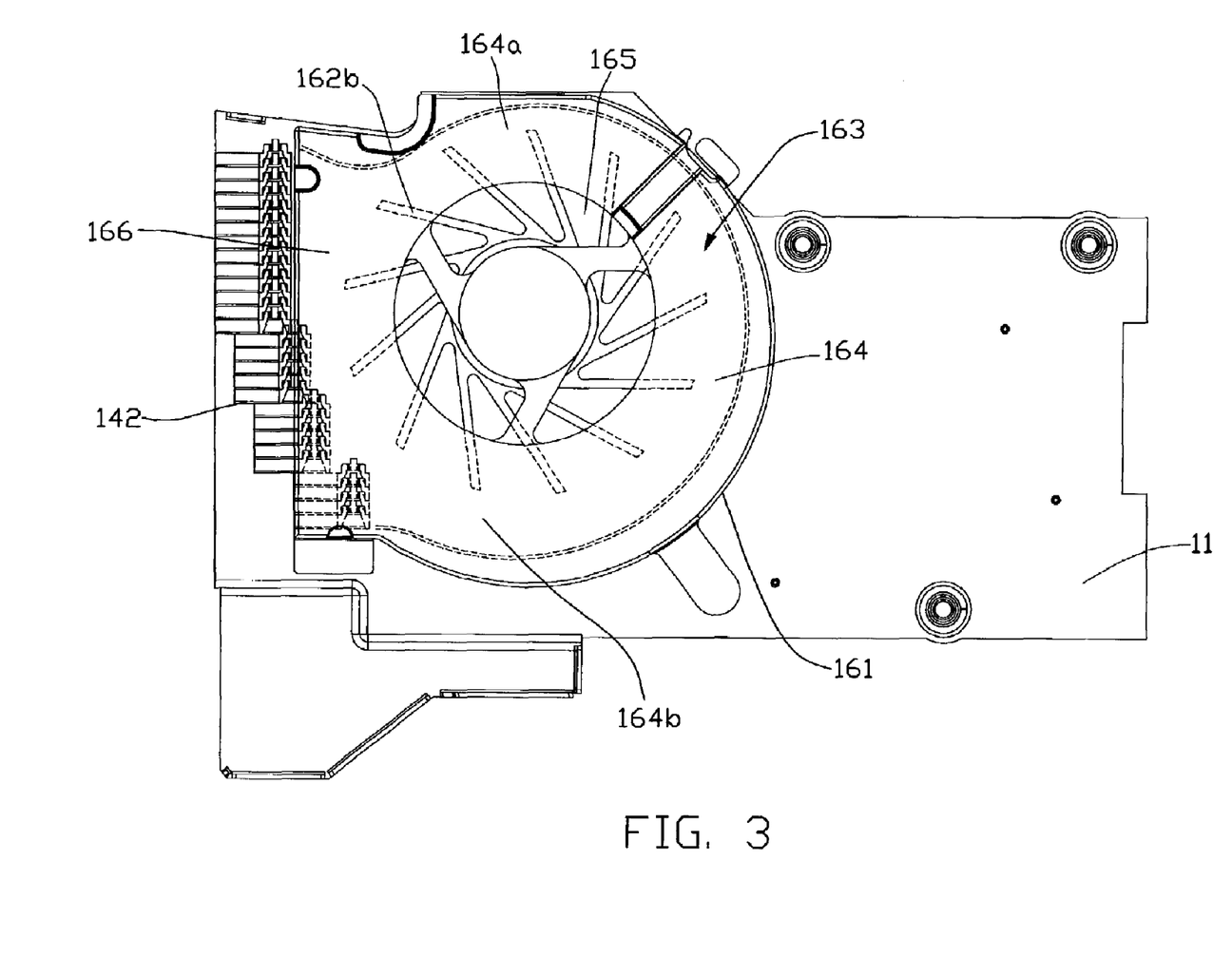
FIG. 3 is a top view of the thermal module of FIG. 2 with some parts thereof being moved away.

Referring to FIG. 3, the heat-dissipating fan 16 is a centrifugal blower mounted to an upper side of the base plate 11 for providing an airflow with a high air pressure. The fan 16 includes a casing 161, a stator (not shown) mounted in the casing 161, and a rotor 162 rotatably disposed around the stator. An accommodating space 163 is enclosed between the casing 161 and the base plate 11 for accommodating the stator and the rotor 162 therein. An air inlet 165 is defined in a top wall of the casing 161. The rotor 162 includes a hub 162a, and a plurality of blades 162b radially extending from the hub 162a. An air channel 164 is formed between free ends of the blades 162b and an inner surface of sidewalls of the casing 161. A width of the air channel 164 is gradually increased along a clockwise direction as viewed from FIG. 3, thereby forming a narrower portion 164a at an upper side of the air channel 164, and a wider portion 164b at a lower side of the air channel 164. As the fan 16 is activated, the blades 162b of the rotor 162 rotate along a clockwise direction around the stator to drive the air in the accommodating space 163 to leave the fan 16 for the fin assembly 14 via the wider portion 164b of the air channel 164.

Figure 4:
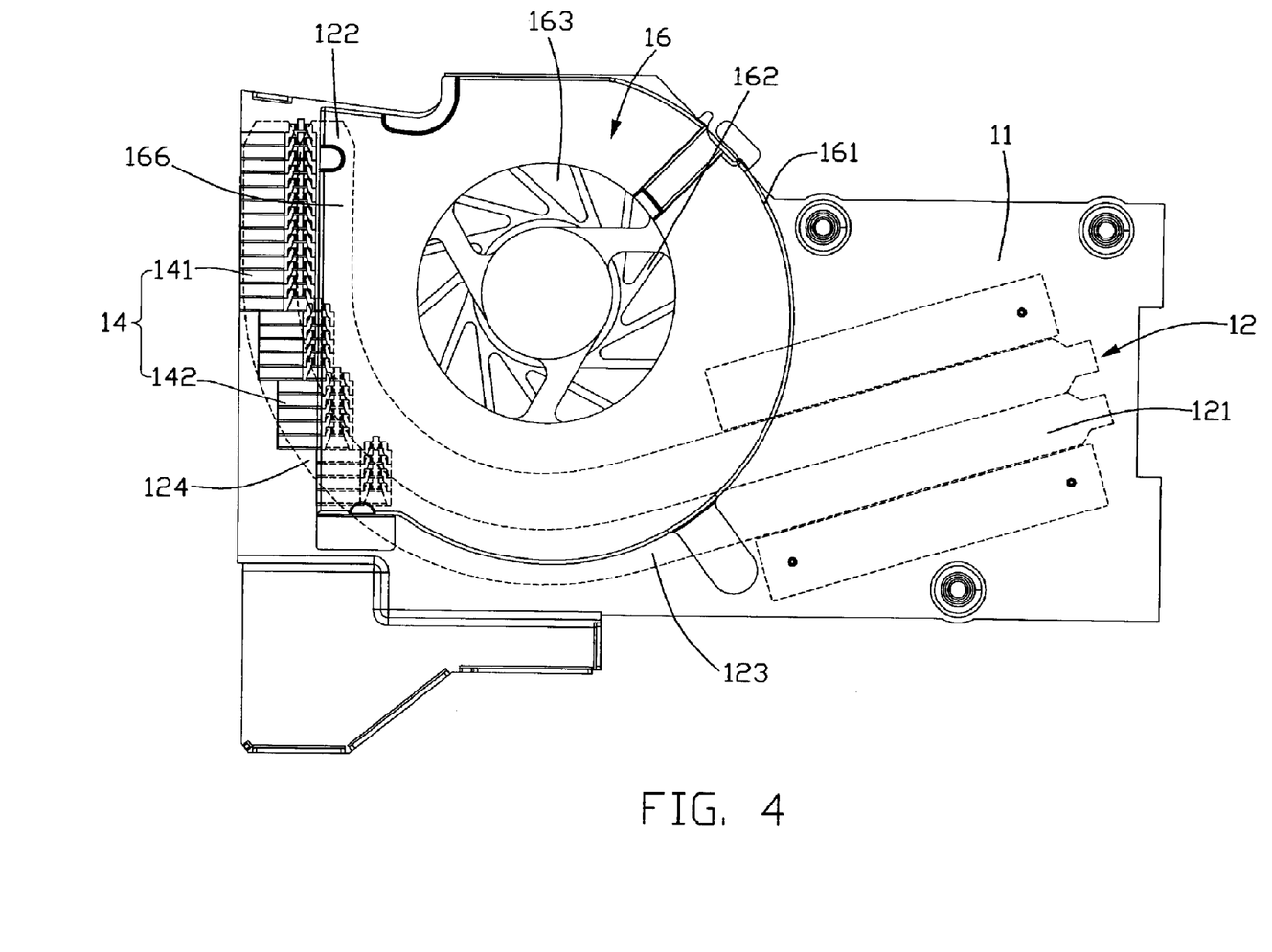
FIG. 4 is a top view of the thermal module of FIG. 2.

Particularly referring to FIG. 4, the two heat pipes 12 are juxtaposed to each other, and are mounted to a bottom side of the base plate 11. Each of the heat pipes 12 includes an evaporator section 121 contacting with a heat-generating electronic component 20, a condenser section 122 remote from the heat-generating electronic component 20 and thermally contacting with the fin assembly 14, and an adiabatic section 123 interconnecting the evaporator section 121 and the condenser section 122. The evaporator section 121 and the adiabatic section 123 of the heat pipe 12 extend along the longitudinal direction of the base plate 11, while the condenser section 122 of the heat pipe 12 extends along the lateral direction of the base plate 11. An arc shaped bending portion 124 is formed on the condenser section 122, adjacent to the adiabatic section 123 of the heat pipe 12. An extension direction of the bending portion 124 is similar to an extension direction of the wider portion 164b of the air channel 164. So a configuration of the bending portion 124 is similar to a configuration of the wider portion 164b of the air channel 164.

The fin assembly 14 is mounted to the upper side of the base plate 11 adjacent to and facing an air outlet 166 of the fan 16. The fin assembly 14 includes a plurality of fins each having a same configuration. The fins are arranged parallel to each other along the lateral direction of the base plate 11 corresponding to the air outlet 166 of the fan 16. The fin assembly 14 includes a rectangular shaped first portion 141 adjacent to the narrower portion 164a of the air channel 164, and a step-shaped second portion 142 adjacent to the wider portion 164b of the air channel 164. The second portion 142 includes three successive steps from the first portion 141, extending in a direction away from a lateral edge of the base plate 11 to which the air outlet 166 is adjacent. The first portion 141 of the fin assembly 14 aligns with the condenser portions 122 of the heat pipes 12, while the second portion 142 of the fin assembly 14 corresponds to the bending portions 124 of the heat pipes 12. The first portion 141 is located immediately close to the lateral edge of the base plate 11. The second portion 142 of the fin assembly 14 is divided into three parts. The three parts of the second portion 142 successively offset from the first portion 11 with increased distance, so that the three parts extend along a direction toward the adiabatic section 123 and the evaporator section 121 of the heat pipe 12. Accordingly, the configuration of the second portion 142 of the fin assembly 14 is similar to the configurations of bending portions 124 of the heat pipes 12 and the wider portion 146b of the air channel 164. In other words, the fins of the second portion 142 of the fin assembly 14 are arranged along an extension direction of the bending portions 124 of the heat pipes 12.

In operation of the thermal module 10, the evaporator sections 121 of the heat pipes 12 absorb heat from the heat-generating component 20, and transfer the heat to the condenser sections 122 of the heat pipes 12 via the evaporation and condensation of the working medium filled in the heat pipes 12. Then, the heat is transferred to the base plate 11 and further to the fin assembly 14. Finally, the heat is taken away by the airflow passing through spaces formed between two adjacent fins. Thus, the heat dissipation of the heat-generating component 20 is accomplished.

In the present invention, the fins of the second portion 142 of the fin assembly 14 are arranged along an extension direction of the bending portions 124 of the heat pipes 12. This will increase thermal contacting areas between the heat pipes 12 and the fin assembly 14. Thus, the heat pipes 12 will transfer more heat directly to the fin assembly 14, thereby increasing heat dissipation efficiency of the thermal module 10. Moreover, the configuration of the second portion 142 of the fin assembly 14 is similar to the configuration of the wider portion 164b of the air channel 164. This makes the fins of the second portion 142 of the fin assembly 14 extend to a position of the wider portion 164b of the air channel 164 adjacent to a high air pressure and high flowing speed area of the airflow field of the airflow generated by the fan 16. So the airflow reaching the second portion 142 of the fin assembly 14, which has a high air pressure and a high flowing speed, can quickly contact with the fins to take away the heat from the fins rapidly. Thus, the heat dissipation efficiency of the thermal module 10 is further improved.

Figure 5:
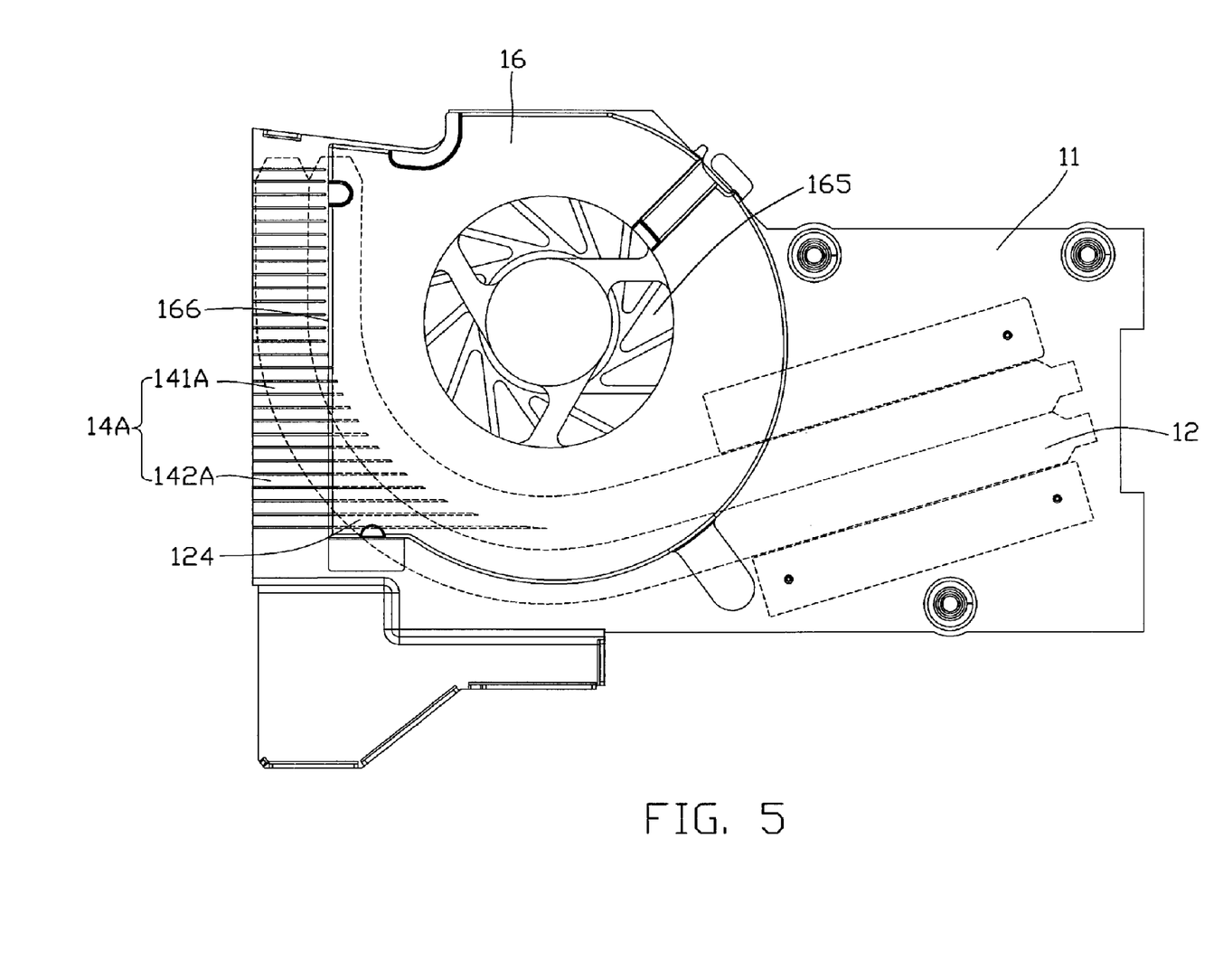
FIG. 5 is a top view of a thermal module according to another embodiment of the present invention.

Referring to FIG. 5, a thermal module in accordance with a second embodiment of the present invention is shown. In the second embodiment, the second portion 142A of the fin assembly 14A includes a plurality of fins having different configurations. A first end of each of the fins of the second portion 142A of the fin assembly 14A is located closely adjacent to the lateral edge of the base plate 11 to which the air outlet 166 of the fan 16 is adjacent. A length of each of the fins of the second portion 142A gradually increases from the first portion 141A so that second ends of the fins of the second portion 142A opposite the first ends thereof are located closer and closer to the adiabatic sections of the heat pipes 12, whereby a line connecting the second ends of the fins of the second portion 142A extend along the extending direction of the bending portions 124 of the condenser sections of the heat pipes 12. So the line connecting the second ends of the fins of the second portion 142A which is adjacent to the wider portion 164b of the air channel 164 is arranged as arc-shaped. The arc-shaped line extends from the first portion 141A towards the adiabatic sections and the evaporator sections of the heat pipes 12. This increases thermally contacting area between the second portion 142A of the fin assembly 14A and the bending portions 124 of the heat pipes 12, and makes the second portion 142A of the fin assembly 14A disposed adjacent to a high air pressure and high flowing speed area of airflow field of the fan 16, which will improve the heat dissipation efficiency of the thermal module 10.

Figure 6:
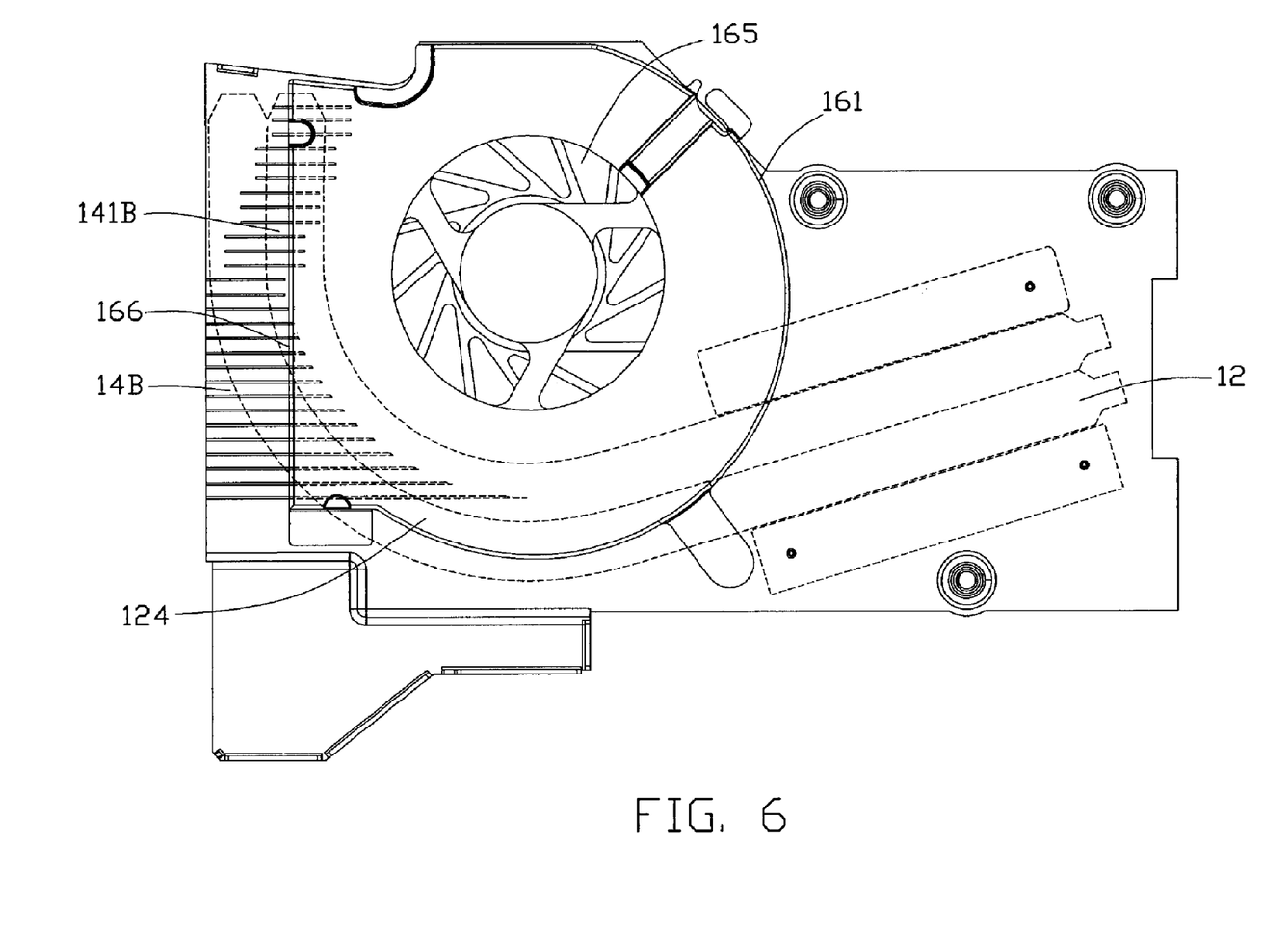
FIG. 6 is a top view of a thermal module according to a third embodiment of the present invention.

Referring to FIG. 6, in a third embodiment of the present invention, the fins of the first portion 141B of the fin assembly 14B are arranged as step-shaped. Alternatively, ends of the fins of the first portion 141B of the fin assembly 14B adjacent to the narrower portion 164a of the air channel 164 may also be arranged as arc-shaped, which makes parts of the first portion 141B of the fin assembly 14B disposed adjacent to a high air pressure and high flowing speed area of airflow field of the fan 16. Thus, the heat dissipation efficiency of the thermal module 10 is further improved.

Figure 7:
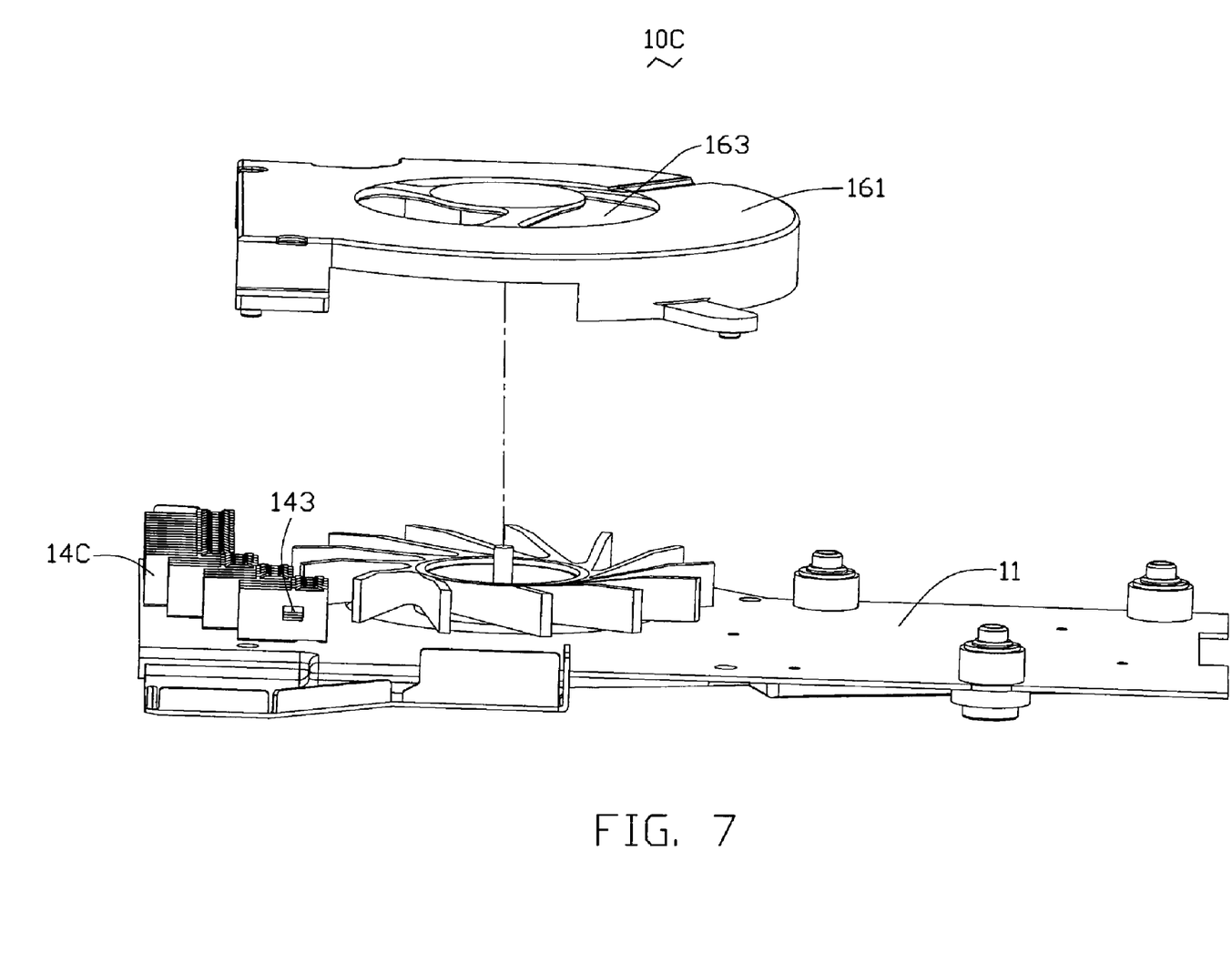
FIG. 7 is an exploded, isometric view of a thermal module according to a fourth embodiment of the present invention.

Referring to FIG. 7, this fourth embodiment is substantially the same as the first embodiment of FIGS. 1 to 4. The only difference therebetween is in that the fins of the fin assembly 14C define a plurality of through holes 143 aligned with each other to improve the air convection of the airflow flowing through spaces of the adjacent fins along a direction perpendicular to the fins, thereby further increasing heat dissipation efficiency of the thermal module 10C.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thermal module adapted for dissipating heat from a heat-generating electronic component comprising:
   a base plate;
   a heat-dissipating fan mounted to one side of the base plate;

at least a heat pipe mounted to another side opposite to the one side of the base plate, the heat pipe comprising an arc-shaped bending portion; and a fin assembly mounted to an air outlet of the heat-dissipating fan, the fin assembly comprising a step-shaped portion corresponding to the arc-shaped bending portion of the heat pipe, the arc-shaped bending portion of the heat pipe being located under the step-shaped portion of the fin assembly.

2. The thermal module as described in claim 1, wherein the heat-dissipating fan comprises an air channel therein, the air channel forming a narrower portion at an upstream side of the air channel, and a wider portion at a downstream side of the air channel.

3. The thermal module as described in claim 1, wherein the fin assembly includes a plurality of fins parallel to each other.

4. The thermal module as described in claim 3, wherein the fins have the same configuration.

5. The thermal module as described in claim 3, wherein ends of the fins of the portion of the fins assembly close to the fan cooperatively form an arc-shaped line extending toward the evaporator section of the heat pipe.

6. The thermal module as described in claim 1, wherein the fins define a plurality of through holes therein.

7. A thermal module comprising:

a base plate;

a blower mounted to one side of the base plate, the blower defining an air channel in a casing thereof the air channel defining a narrower portion at an upstream side of the air channel and a wider portion at a downstream side of the air channel;

at least a heat pipe mounted to another side opposite to the one side of the base plate; and a fin assembly mounted to an air outlet of the blower, adapted for absorbing heat from a heat-generating component via the heat pipe and the base plate, the fin assembly comprising a step-shaped portion extending into the wider portion of the air channel.

8. The thermal module as described in claim 7, wherein the heat pipe comprises an arc-shaped bending portion located under the step-shaped portion of the fin assembly.

9. The thermal module as described in claim 8, wherein the wider portion of the air channel is arc-shaped.

10. The thermal module as described in claim 7, wherein the fin assembly includes a plurality of fins parallel to each other.

11. The thermal module as described in claim 10, wherein the fins have the same configuration.

12. The thermal module as described in claim 10, wherein ends of the fins of the portion of the fins assembly adjacent to the wider portion of the air channel are arranged as arc-shaped.

13. A thermal module comprising:

a base plate having a top side and a bottom side and a lateral edge;

a fan mounted on the top side of the base plate, having an air outlet located near the lateral edge of the base plate;

a fin assembly mounted on the top side of the base plate, located at the air outlet of the fan;

a heat pipe mounted on the bottom side of the base plate, having an evaporator section adapted for receiving heat from an electronic component, and a condenser section located under the fin assembly for releasing the heat to the fin assembly, the condenser section having an arc-shaped bending portion, wherein the fin assembly has a step-shaped portions, the arc-shaped bending portion of the condenser section of the heat pipe being located under the step-shaped portion of the fin assembly.

14. The thermal module of claim 13, wherein the arc-shaped bending portion is located between an end portion of the condenser section and the evaporator section of the heat pipe.

15. The thermal module of claim 13, wherein ends of fins of the portion of the fin assembly distant from the lateral edge of the base plate cooperatively forms an arc-shaped line.

* * * * *